(12) United States Patent
Hirakawa et al.

(10) Patent No.: US 7,736,690 B2
(45) Date of Patent: Jun. 15, 2010

(54) METHOD FOR MANUFACTURING AN ELECTRICAL TEST PROBE

(75) Inventors: Hideki Hirakawa, Aomori (JP); Yuko Yamada, Aomori (JP); Yosuke Yoshizawa, Ibaraki (JP); Takayuki Hayashizaki, Aomori (JP); Akira Soma, Aomori (JP); Shinji Kuniyoshi, Tokyo (JP)

(73) Assignee: Kabushiki Kaisha Nihon Micronics, Musashino-shi, Tokyo (JP)

( * ) Notice: Subject to any disclaimer, the term of this patent is extended or adjusted under 35 U.S.C. 154(b) by 125 days.

(21) Appl. No.: 12/017,300

(22) Filed: Jan. 21, 2008

(65) Prior Publication Data

US 2008/0186038 A1 Aug. 7, 2008

(30) Foreign Application Priority Data

Feb. 1, 2007 (JP) .............................. 2007-022663

(51) Int. Cl.
*B05D 5/12* (2006.01)
(52) U.S. Cl. .......................... 427/58; 427/123; 427/256; 427/282
(58) Field of Classification Search .................... 427/58, 427/123, 256, 282
See application file for complete search history.

(56) References Cited

U.S. PATENT DOCUMENTS 6,825,422 B2 * 11/2004 Eldridge et al. ............. 174/260

FOREIGN PATENT DOCUMENTS

WO   WO 2006/075408 A1    7/2006

* cited by examiner

*Primary Examiner*—Brian K Talbot
(74) *Attorney, Agent, or Firm*—Ingrassia Fisher & Lorenz, P.C.

(57) ABSTRACT

A probe tip section of an electrical test probe has a laminated structure consisting of a first deposition portion and a second deposition portion covering the first deposition portion, and by the laminated structure, a maximum cross-sectional area portion at which the cross-sectional area of the probe tip section is increased to a base portion is provided between a tip end of the probe tip section and the base portion in the probe tip section. At the maximum cross-sectional area portion, a dimension in the X direction as seen on a flat surface perpendicular to a protruding direction of the probe tip section is increased in a one-dimensional way, and in addition, a dimension in the Y direction perpendicular to the X direction is increased from the tip end toward the base portion, as a result of which the cross-sectional area of the probe tip section can be increased in a two-dimensional way. Thus, the cross-sectional area at the maximum cross-sectional area portion reaching the base portion of the probe tip section can be made to be larger than in the conventional case, and along with the increase of the cross-sectional area, the stress acting on the base portion can be lowered.

10 Claims, 8 Drawing Sheets

METHOD FOR MANUFACTURING AN ELECTRICAL TEST PROBE

BACKGROUND OF THE INVENTION

The present invention relates to an electrical test probe suitable for use in an electrical test of a plurality of semiconductor integrated circuits formed on a semiconductor wafer and a method for manufacturing the same.

A plurality of semiconductor integrated circuits formed on a semiconductor wafer generally undergo an electrical test before being separated into respective chips to determine whether or not they are manufactured in accordance with the specification. In this electrical test, a probe assembly comprising electrical test probes to be connected to electrodes of devices under test that are the respective semiconductor integrated circuits is used. The devices under test are connected to a tester via this probe assembly.

One of the conventional probes used for this probe assembly is one comprising a plate-shaped probe main body section and a probe tip section provided on the probe main body section and that is to abut on an electrode of a device under test (for example, refer to Patent Document 1). The probe main body section has an attachment portion to a probe board, a pair of arm portions extending from the attachment portion to the lower side of the probe board laterally along the probe board with a space from the probe board, and a pedestal portion formed integrally with the arm portions so as to combine the ends of the both arm portions, and the aforementioned probe tip section is provided on the pedestal portion. In Patent Document 1, it is proposed that the probe main body section should be made of a highly tough conductive material, and the probe tip section provided at the lower end of the pedestal portion of the probe main body section should be made of a metal material with excellent hardness.

By forming the probe main body section by the highly tough metal material, the probe tip section can be made to slide on the electrode along with elastic deformation of the arm portions of the probe main body section when the probe tip section of the probe is thrust to the electrode of the device under test. This slide of the probe tip enables oxide films on the electrode to be scraped away. Thus, by letting an overdriving force that causes the aforementioned elastic deformation act on the arm portions of the probe, the oxide films of the electrode are removed by the probe tip of the aforementioned probe tip section, and reliable electrical contact between them is obtained. Also, by forming this probe tip section by the highly hard material, abrasion of the probe tip caused by the slide is suppressed.

Meanwhile, such a probe is microscopic. Thus, in manufacturing the probe, a photolithographic technique adopted in the semiconductor manufacturing technique is utilized. Specifically, a resist pattern having openings corresponding to the probe tip section and the probe main body section is formed on a base table with a photosensitive photoresist, and respective metal materials are selectively deposited in the respective openings for the probe tip section and the probe main body section, thus to form a probe. Also, the probe tip section is formed with its base portion buried in the probe main body section. When the probe tip of the probe or the tip end of the probe tip section is thrust to the device under test, an acting force such as bending or shearing concentrates on the base portion of the probe tip section in a lateral direction parallel to the sliding direction as a result of the aforementioned slide of the probe tip. When the stress on the base portion increases by the concentration of the acting force on the base portion, deterioration of the probe tip section at its base portion will be accelerated.

In an attempt to decrease the stress on the base portion of the probe tip section, the flat surface shape of the opening of the resist pattern for formation of the probe tip section is formed in a tapered shape so as to be broadened toward the end surface of the base portion, and thus the cross-sectional shape of the probe tip section at its base portion is broadened toward the end surface of the base portion coupled with the probe main body section.

However, in the conventional case, the thickness in the Y direction, which is a direction of depositing the metal material for the probe tip section as seen on a flat surface perpendicular to the protruding direction of the probe tip section, is uniform, as described above. Increase of the cross-sectional area of the base portion is attempted only by increase of the width dimension along the X direction perpendicular to the Y direction as seen on the aforementioned flat surface. Such increase of the dimension is restricted along with miniaturization of ICs.

Accordingly, it has been desired to attempt to improve durability of the probe by further improvement of durability of the probe tip section and further decrease of stress.

[Patent Document 1] International Publication WO2006/075408 Pamphlet

BRIEF SUMMARY OF THE INVENTION

It is an object of the present invention to attempt to improve durability of the probe tip section of the probe.

An electrical test probe according to the present invention comprises a probe tip section and a probe main body section having a pedestal portion on which the probe tip section is formed to be protruded, wherein the probe main body section is formed by deposition of a conductive material that is greater in toughness than the probe tip section, and the probe tip section is formed by deposition of a conductive material that is higher in hardness than the material of the probe main body section, and wherein the probe tip section is formed with its base portion buried in the pedestal portion, the probe tip section has a laminated structure consisting of a first deposition portion and a second deposition portion covering the first deposition portion, by the laminated structure, a maximum cross-sectional area portion at which the cross-sectional area of the probe tip section is increased to the base portion is provided between a tip end of the probe tip section and the base portion in the probe tip section, and at the maximum cross-sectional area portion, both a dimension in the X direction as seen on a flat surface perpendicular to a protruding direction of the probe tip section and a dimension in the Y direction perpendicular to the X direction are increased from the tip end toward the base portion.

With the electrical test probe according to the present invention, since, in the probe tip section, a dimension in the X direction as seen on a flat surface perpendicular to a protruding direction of the probe tip section is increased in a one-dimensional way between a tip end of the probe tip section and the base portion, and in addition, a dimension in the Y direction perpendicular to the X direction is increased from the tip end toward the base portion, the cross-sectional area of the probe tip section can be increased in a two-dimensional way. Thus, the cross-sectional area at the maximum cross-sectional area portion reaching the base portion of the probe tip section can be made to be larger than in the conventional case, and along with the increase of the cross-sectional area, the stress acting on a portion of the probe tip section in proximity to the base portion can be lowered. Also, since this does not cause increase of the entire thickness dimension of the probe tip section, unnecessary weight increase or great cost increase will not occur.

The probe main body section may be constituted by an attachment portion similar to a conventional one and a pair of arm portions extending in a lateral direction from the attachment portion to be distanced from each other in its height direction, and the pedestal portion may be formed to extend to the opposite side of a side where the attachment portion is located, seen from the arm portions, so as to connect extending ends of the arm portions.

A manufacturing method according to the present invention is a method for manufacturing a probe comprising a probe tip section and a probe main body section having a pedestal portion on which the probe tip section is formed to be protruded and comprises the step of, after depositing a metal material on a base table to form a first deposition portion for the probe tip section, forming a second deposition portion entirely covering the first deposition portion, wherein combination of the first deposition portion and the second deposition portion causes increase of the thickness dimension of the probe tip section along the deposition direction of the metal material for the probe tip section.

With the manufacturing method according to the present invention, since the probe tip section is constituted by a first deposition portion and a second deposition portion covering the first deposition portion, in terms of the probe tip section, a dimension in the X direction can be increased toward the base portion in accordance with a flat surface shape of a mask for the probe tip section, and in addition, a dimension in the Y direction perpendicular to the X direction (deposition direction) can be increased toward the base portion due to combination of the first deposition portion and the second deposition portion. Thus, since the dimensions both in the X direction and in the Y direction perpendicular to this as seen on the cross-sectional surface of the probe tip section can be increased between a tip end of the probe tip section and the base portion, the probe according to the present invention can be formed relatively easily and efficiently.

After deposition of a metal material on the base table for formation of the first deposition portion for the probe tip section, the second deposition portion covering the first deposition portion may form a flat surface shape of the probe tip section.

The first deposition portion may constitute a core portion for the probe tip section, and the second deposition portion and the core portion may constitute the probe tip section. This second deposition portion may be formed by forming the core portion, thereafter forming a resist pattern having an opening that exposes the entire region of the core portion and is formed in a flat surface shape corresponding to the flat surface shape of the probe tip section containing a probe tip of the probe tip section, and depositing the metal material for the probe tip section in the opening. Also, after removal of the resist pattern, a resist pattern covering the probe tip of the probe tip section and having an opening that exposes an upright portion of the second deposition portion deposited at least along the core portion at an end portion opposite the probe tip and is formed in a flat surface shape corresponding to a flat surface shape of the probe main body section may be formed, and a metal material for the probe main body section may be deposited in the opening of the resist pattern.

For the metal material for the probe main body section, a conductive material that is greater in toughness than the metal material for the probe tip section may be used. Also, for the metal material for the second deposition portion, a conductive material that is higher in hardness than the metal material for the probe main body section may be used. Further, the same metal material may be used for the first deposition portion as the core portion and the second deposition portion.

In such a case, nickel or a nickel alloy such as a nickel-tin alloy, which is an alloy of nickel and tin, may be used for the metal material for the probe main body section, for example. Also, a hard metal such as rhodium or a palladium-cobalt alloy may be used for the metal material for the probe tip section, for example.

Prior to formation of the core portion, a stepped sacrificial layer having a lower portion and an upper portion may be formed on the base table. In such a case, the metal material for the probe main body section may be deposited in a layered form to continue into the lower portion of the sacrificial layer so as to be on approximately the same height level as that of the lower portion. After formation of this one side portion, the first deposition portion and the second deposition portion are formed in relation to the sacrificial layer. At this moment, either of the metal materials for the first deposition portion and the second deposition portion may be deposited to cover a part of the one side portion. After deposition of either metal material for the deposition portion on the one side portion, by depositing the metal material for the probe main body section on the one side portion to correspond to the one side portion, the probe tip section may be formed with its base end portion buried in the probe main body section.

The first deposition portion as the core portion may be formed to extend on the one side portion. In such a case, the combination portion of the core portion and the second deposition portion covering the core portion may form the base end portion, which is a connection portion to the main body section.

The one side portion of the probe main body section may be formed by forming a resist pattern having an opening corresponding to the outer shape of the probe main body section and covering the sacrificial layer and thereafter depositing the metal material in the opening of the resist pattern. Also, after deposition of the metal material for the one side portion, the remaining portion of the probe main body section may be formed by depositing the metal material for the probe main body section on the one side portion, using a resist pattern having the same shape as that of the resist pattern used to form the one side portion. Thus, the base end portion of the probe tip section may be buried in the probe main body section.

With the probe according to the present invention, since the cross-sectional area at the maximum cross-sectional area portion reaching the base portion of the probe tip section is made to be larger than in the conventional case as described above, which enables to lower the stress acting on the base portion more effectively, it is possible to attempt to further improve durability of the probe.

Also, with the manufacturing method according to the present invention, a probe with excellent durability can be formed relatively easily by utilizing a photolithographic technique.

BRIEF DESCRIPTION OF THE DRAWINGS

FIGS. 6(a), 6(b), 6(c), and 6(d) are the front view, side view, back view, and bottom view, respectively, similar to FIGS. 3(a) to 3(d).

DESCRIPTION OF THE PREFERRED EMBODIMENTS

Figure 1:
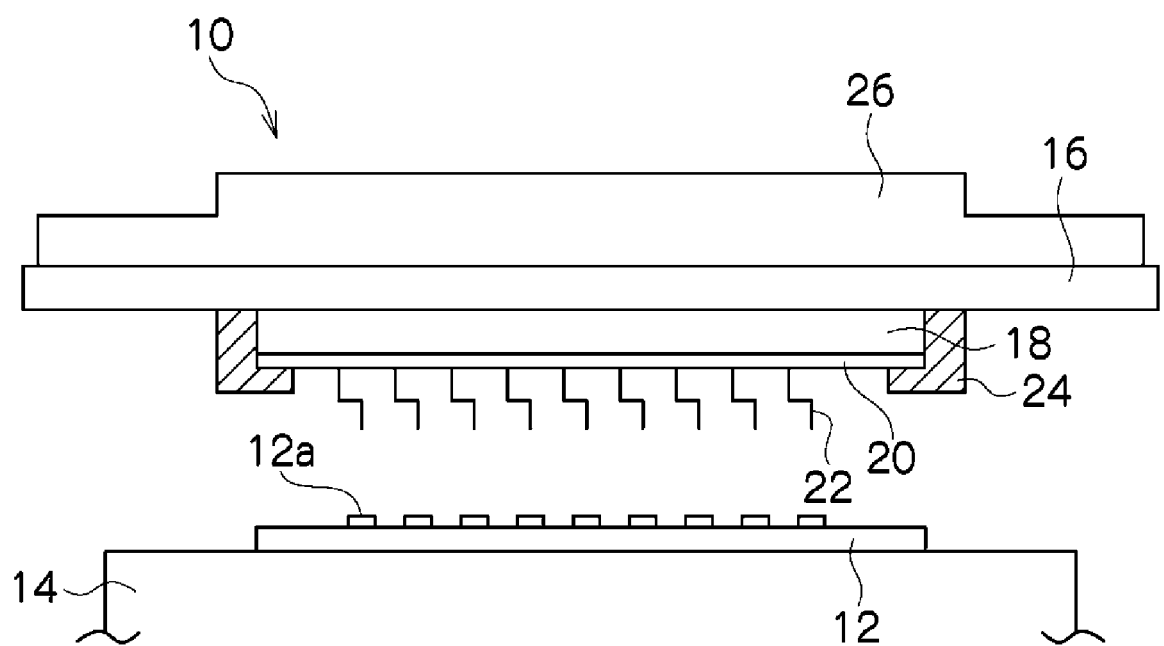
FIG. 1 is a schematic view partially showing a probe assembly having a probe according to the present invention.

A probe assembly 10 according to the present invention is used for an electrical test of a plurality of integrated circuits (not shown) formed on a semiconductor wafer 12 as shown in FIG. 1. The semiconductor wafer 12 is removably held on a vacuum chuck 14, for example, with a plurality of electrodes 12a formed on its one surface directing upward. The probe assembly 10 is supported by a not shown frame member to be movable relatively to the vacuum chuck 14 in directions approaching and distanced from the semiconductor wafer 12 on the vacuum chuck 14 for the electrical test of the aforementioned integrated circuits of the semiconductor wafer 12.

The probe assembly 10 comprises a printed wiring board 16 and a probe board 20 piled up on the printed wiring board via a ceramic board 18. On one surface of the probe board 20 are arranged and attached a plurality of probes 22 according to the present invention. The ceramic board 18 and the probe board 20 are attached to the printed wiring board 16 so as to be piled on the lower surface of the printed wiring board 16 via a conventionally well-known attachment ring assembly 24 made of a dielectric material such as a ceramic so that the probes 22 attached to the probe board direct downward.

On the upper surface of the printed wiring board 16 is arranged a reinforcement member 26 that is made of a metal material and allows partial exposure of the aforementioned upper surface of the printed wiring board 16. The probe board 20, the ceramic board 18, the printed wiring board 16, the reinforcement member 26, and the attachment ring assembly 24 are integrally combined by not shown combining members similar to conventional ones such as bolts.

The probe board 20 is a multi-layered wiring board, for example. In the probe board 20 are formed not shown conventionally well-known conductive paths. The probes 22 are attached to the probe board 20 so that they are fixedly connected to the aforementioned corresponding conductive paths. The aforementioned respective conductive paths in the probe board 20 corresponding to the probes 22 are electrically connected to tester connecting portions (not shown) arranged in an area exposed from the reinforcement member 26 on the upper surface of the printed wiring board 16 via respective conductive paths (not shown) respectively penetrating the ceramic board 18 and the printed wiring board 16 as in a conventionally well-known manner and are connected to a circuit of a not shown tester main body via the tester connecting portions.

Accordingly, by letting either the probe assembly 10 or the vacuum chuck 14 move so as to be close to each other so that the respective probes 22 of the probe assembly 10 abut on the corresponding electrodes 12a on the semiconductor wafer 12 as a device under test, the electrodes 12a can be connected to the circuit of the aforementioned tester main body, and thus an electrical test of the device under test 12 can be performed.

Figure 2:
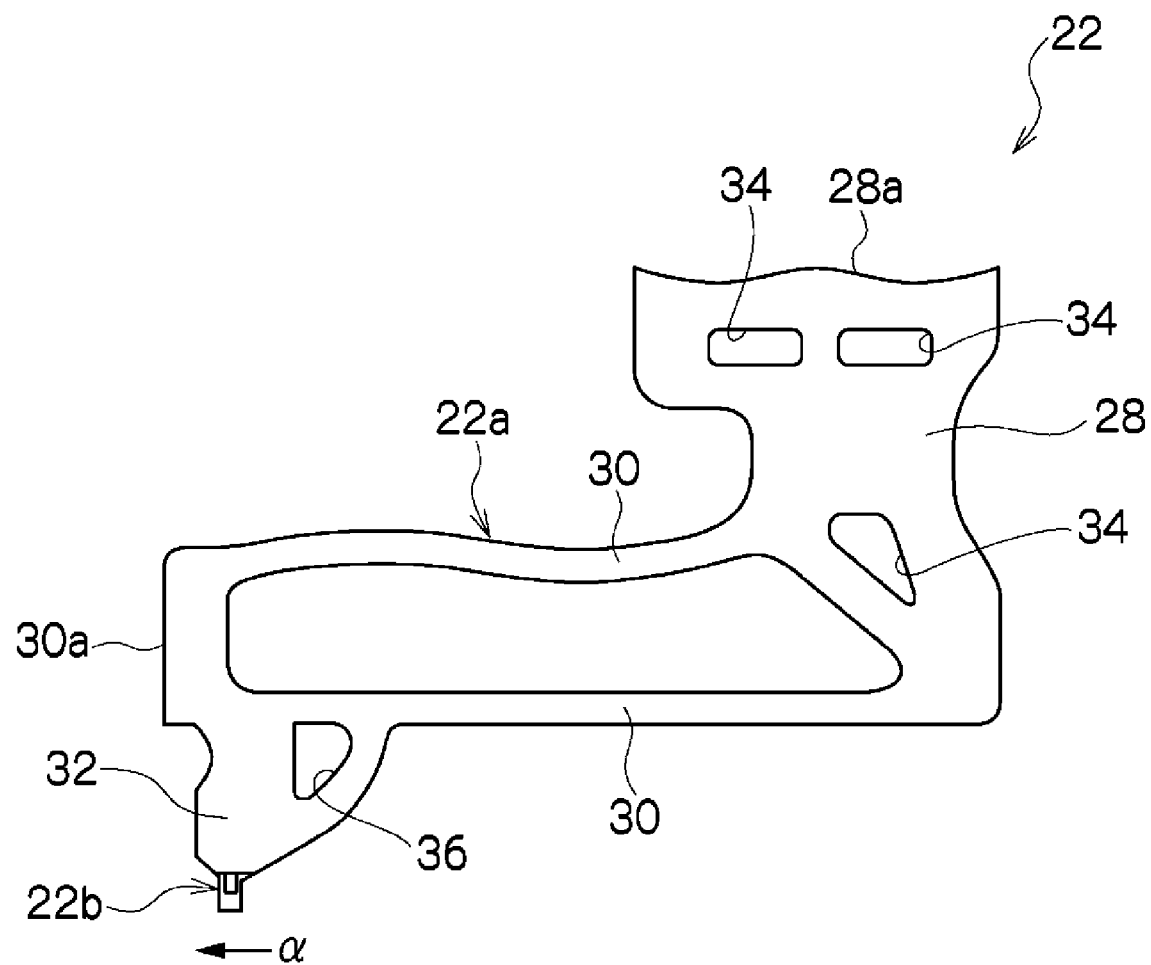
FIG. 2 is an enlarged front view of the probe shown in FIG. 1.

Referring to FIG. 2, which is an enlarged view of each probe 22, each probe 22 comprises a plate-shaped probe main body section 22a made of a metal material such as nickel or a nickel-chromium alloy and a probe tip section 22b made of a hard metal material such as rhodium. The both sections 22a and 22b, made of these metal materials, exhibit relatively good conductivity. Also, as for the features of the both sections 22a and 22b, made of these metal materials, the probe main body section 22a is greater in toughness than the probe tip section 22b while the probe tip section 22b is higher in hardness than the probe main body section 22a.

The probe main body section 22a may be made of a highly flexible or tough metal material with excellent toughness such as a nickel alloy including, for example, a nickel-phosphorus alloy, a nickel-tungsten alloy, and a nickel-cobalt alloy, phosphor bronze, or a palladium-cobalt alloy, instead of the aforementioned metal material. Also, the probe tip section 22b may be made of a highly hard metal material other than rhodium arbitrarily.

In the example shown in the figure, the probe main body section 22a comprises an attachment portion 28 at which an attachment end 28a to be attached to the aforementioned conductive path in the probe board 20 is provided and a pair of arm portions 30, 30 extending in a lateral direction from the lower end of the attachment portion to be distanced from each other. At the tip ends of the both arm portions 30, 30 is formed a connection portion 30a connecting the both tip ends. A pedestal portion 32 is formed to continue into the connection portion 30a at the tip ends. The pedestal portion 32 extends to the opposite side of a side where the attachment portion 28 is located, seen from the arm portions 30, 30, that is, to the lower side.

In the example shown in the figure, a plurality of openings 34 are formed at the attachment portion 28, and an opening 36 is formed at the pedestal portion 32. These openings 34, 36 may be eliminated. However, it is preferable to provide the openings 34 for the purpose of promoting the etching effect for detachment of the probe 22 from a base table in steps for manufacturing the probe 22 described later. Also, it is preferable to form the opening 36 for the purpose of applying after-mentioned flexibility to the pedestal portion 32 in association with flexible deformation of the arm portions 30 when an overdriving force that gives the flexible deformation to the arm portions 30, 30 acts on the probe 22.

At the extending end of the pedestal portion 32 is provided the aforementioned probe tip section 22b to be protruded from its end surface. The probe tip section 22b is enlarged and shown in FIGS. 3(a), 3(b), 3(c), and 3(d), which are the front view, side view, back view, and bottom view, respectively. Also, its cross section is shown in FIG. 4.

The probe tip section 22b consists of a first deposition portion 38a formed by deposition of a metal material described later and a second deposition portion 38b formed to cover the first deposition portion. The second deposition portion 38b is formed to entirely cover the first deposition portion 38a as seen in a state of the flat surface shape of the probe tip section 22b shown in FIGS. 3(a) and 3(c) and determines the flat surface shape or the outer shape of the probe tip section 22b. The second deposition portion 38b, which determines the outer shape of the probe tip section 22b, forms a base portion 40a of the probe tip section 22b buried within the pedestal portion 32 and also forms a probe tip main body portion 40b continuing into the base portion and protruded from the end surface of the pedestal portion 32.

The base portion 40a is formed in a rectangular flat surface shape whose longitudinal direction is the X direction along the lateral direction. Also, the probe tip main body portion 40b has a tapered region at which the width dimension W along the X direction gradually decreases from the base portion 40a toward the probe tip having a uniform width dimension as seen in a state of the flat surface shape of the probe tip section 22b shown in FIGS. 3(a) and 3(c).

Figure 3:
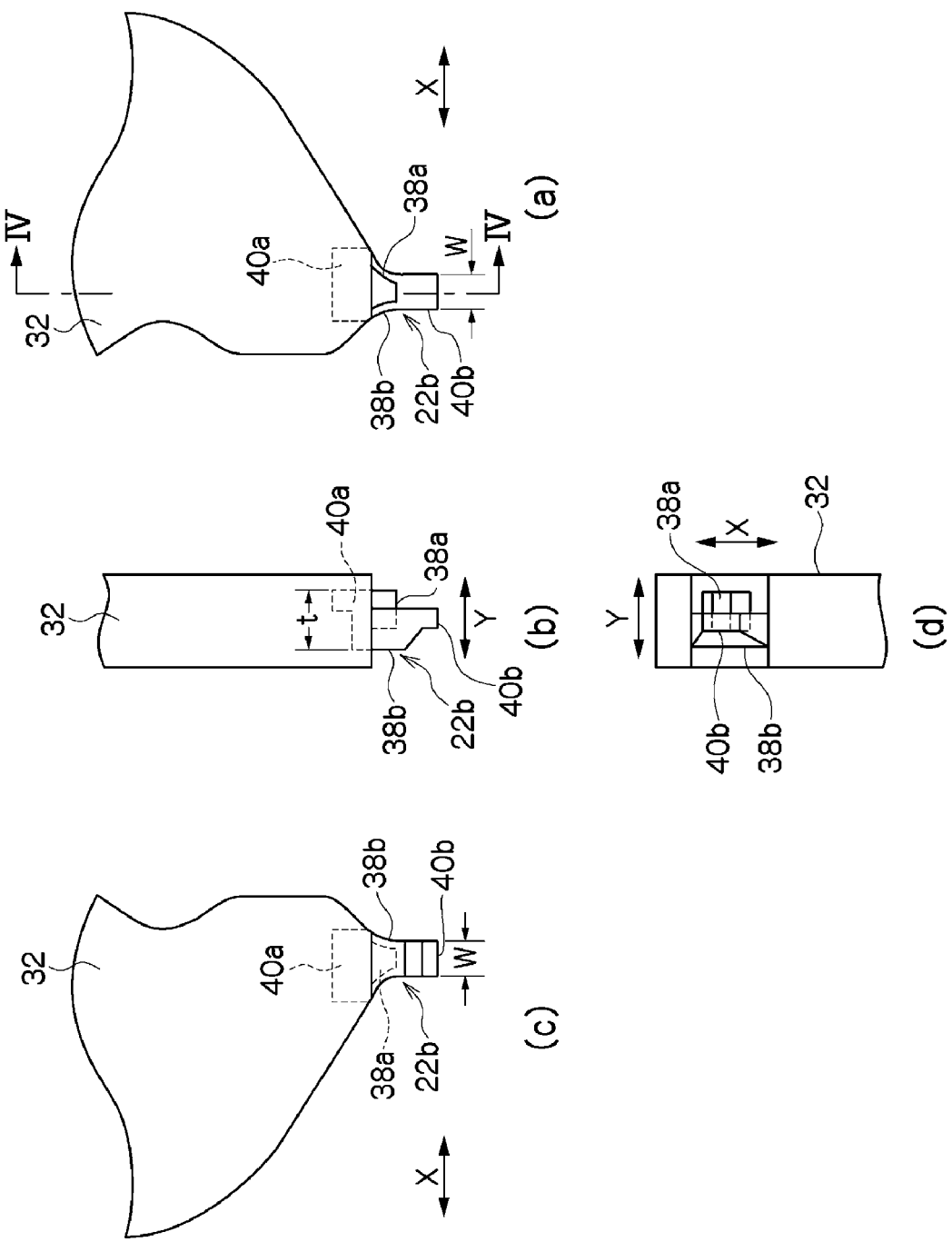
FIGS. 3(a) to 3(d) are partially enlarged views of the probe shown in FIG. 2, and FIGS. 3(a), 3(b), 3(c), and 3(d) are the front view, side view, back view, and bottom view, respectively.
Figure 4:
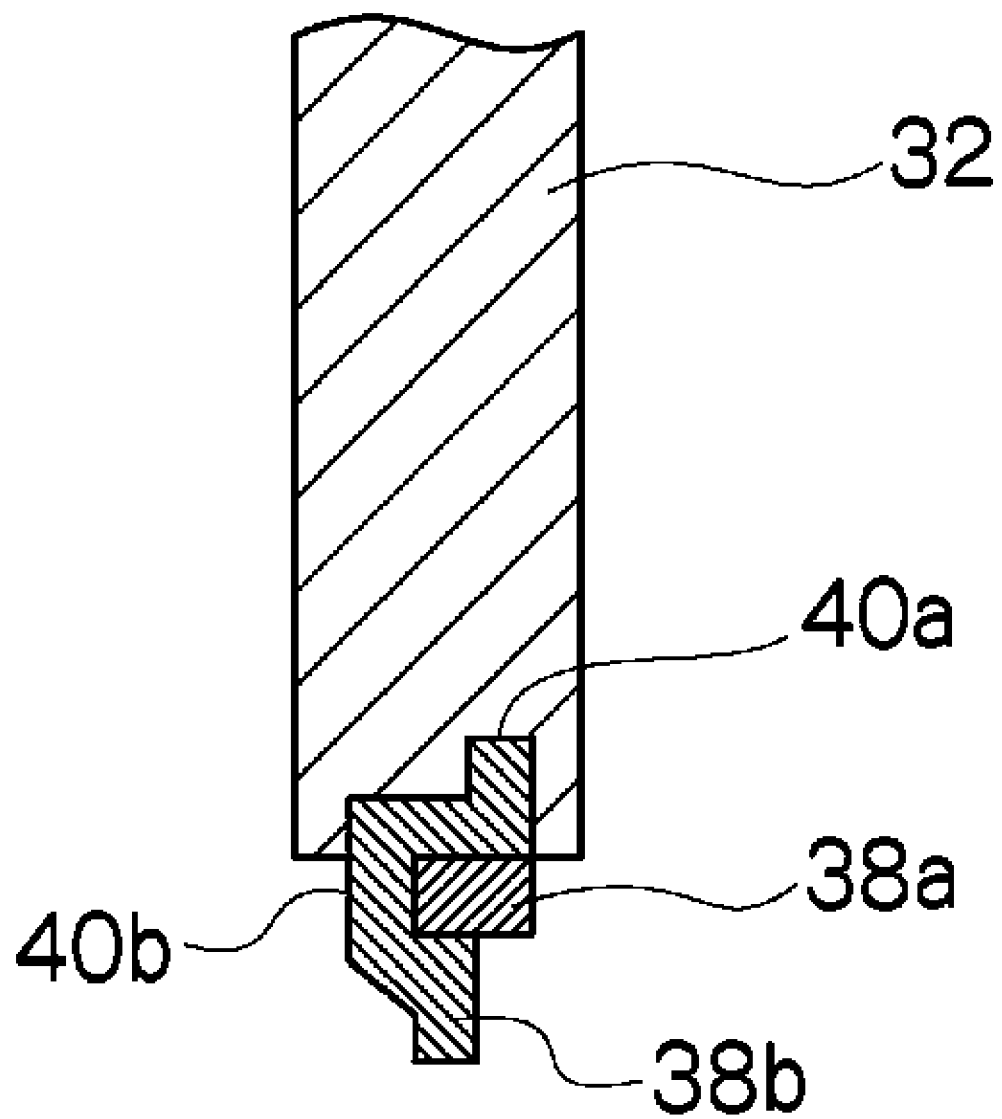
FIG. 4 is a cross-sectional view obtained along the line IV-IV shown in FIG. 3(a).

In the example shown in FIG. 3, the first deposition portion 38a has a uniform thickness dimension in the Y direction along the thickness dimension direction of the pedestal portion 32 shown in FIG. 3(b) and is arranged in the vicinity of the tip end of the pedestal portion 32, abutting on the tip end. The first deposition portion 38a has a shorter width dimension than the width dimension of the second deposition portion 38b and gradually decreases the width dimension from the tip end of the pedestal portion 32 toward the aforementioned probe tip, as seen in a state of the flat surface shape of the probe tip section 22b shown in FIGS. 3(a) and 3(c). Also, the lower end of the first deposition portion 38a never reaches the probe tip of the probe tip main body portion 40b having the uniform width dimension W. The first deposition portion 38a, in cooperation with the second deposition portion 38b, functions as a core portion for partially increasing the plate thickness dimension along the Y direction of the probe tip section 22b.

As described above, the probe tip section 22b is formed by combination of the first deposition portion 38a and the second deposition portion 38b entirely covering the flat surface region of the first deposition portion. Also, each width dimension (W) along the X direction of the base portion 40a and the probe tip main body portion 40b of the probe tip section 22b is determined by the width dimension along the X direction of the second deposition portion 38b, and the width dimension of the probe tip main body portion 40b gradually increases from the aforementioned probe tip toward the base portion 40a as in the conventional case. Also, the thickness dimension (t) along the Y direction of the probe tip main body portion 40b of the probe tip section 22b gradually increases from the aforementioned probe tip toward the combination portion of the first deposition portion 38a and the second deposition portion 38b, and the probe tip section 22b is coupled with the pedestal portion 32 at a portion having the maximum thickness dimension t.

Thus, the cross-sectional area of the probe tip section 22b across the Z direction perpendicular to the X direction and the Y direction increases in a two-dimensional way in accordance with the gradual increase of the width dimension in the X direction toward the base portion 40a and the increase of the thickness dimension in the Y direction. Accordingly, the extent of the cross-sectional increase from the aforementioned probe tip toward the base portion 40a located within the pedestal portion 32 of the probe tip section 22b can be set to be greater than in the conventional case.

Thus, when the probe tip section 22b is thrust to the electrode 12a of the semiconductor wafer 12, the aforementioned probe tip slightly slides in a direction shown by an arrow a in FIG. 2 along with the flexible deformation of the pair of arm portions 30, 30. The opening 36 formed at the pedestal portion 32 facilitates deformation of the pedestal portion 32 in the a direction along with this slide and thus promotes the slide of the aforementioned probe tip. Also, when this slide occurs, a strong acting force such as bending or shearing in a lateral direction along the sliding direction α concentrates on a portion of the probe tip main body portion 40b of the probe tip section 22b in proximity to the base portion 40a. However, since the cross-sectional area at the portion of the probe tip main body portion 40b in proximity to the base portion 40a can be set to be larger than in the conventional case, the stress can be lowered more than in the conventional case.

As a result, since the mechanical strength at the portion of the probe tip main body portion 40b in proximity to the base portion 40a can be increased more than in the conventional case, the durability of the probe 22 is enhanced.

Figure 5:
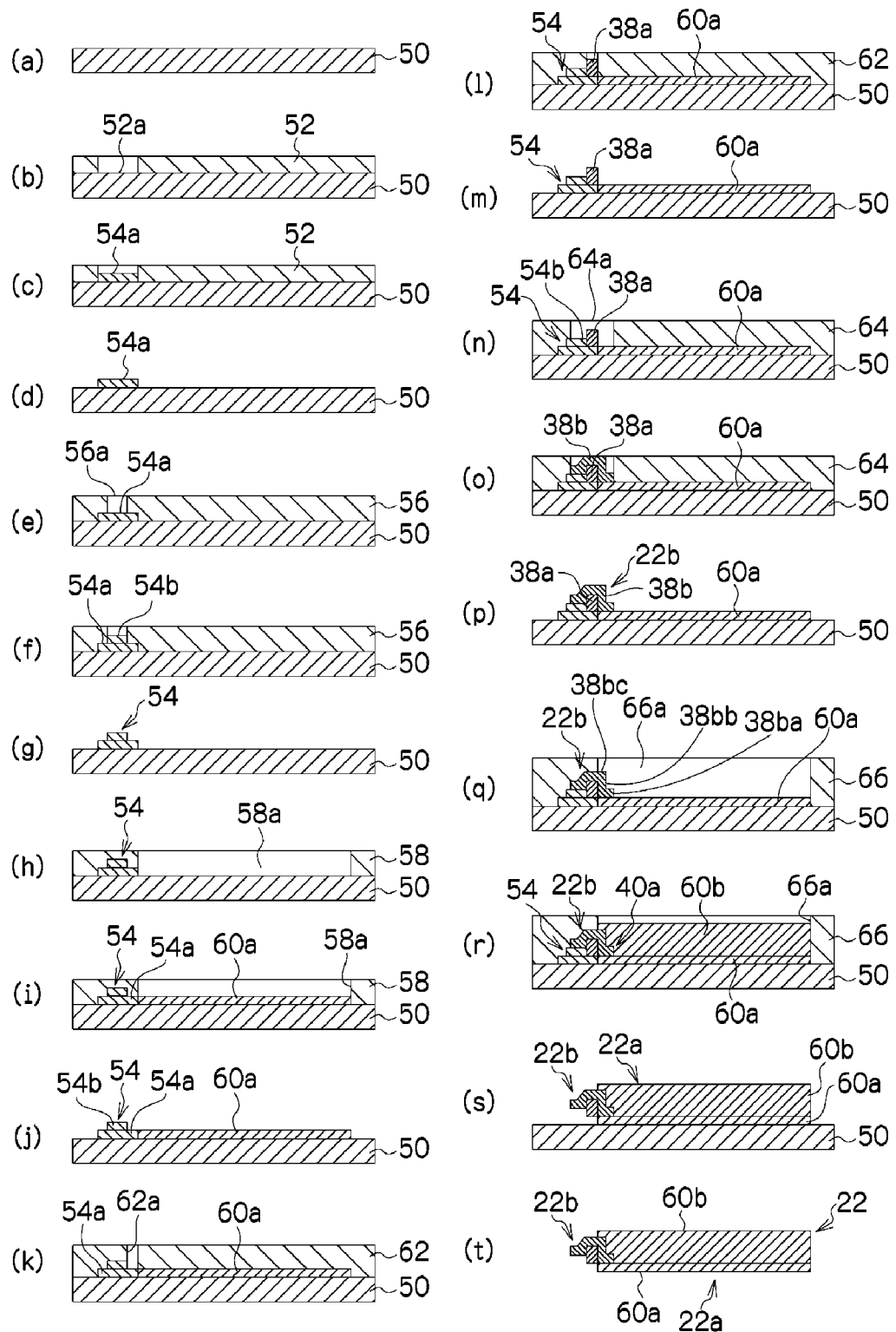
FIGS. 5(a) to 5(t) are schematic diagrams showing respective steps of a method for manufacturing the probe shown in FIG. 3.
Figure 6:
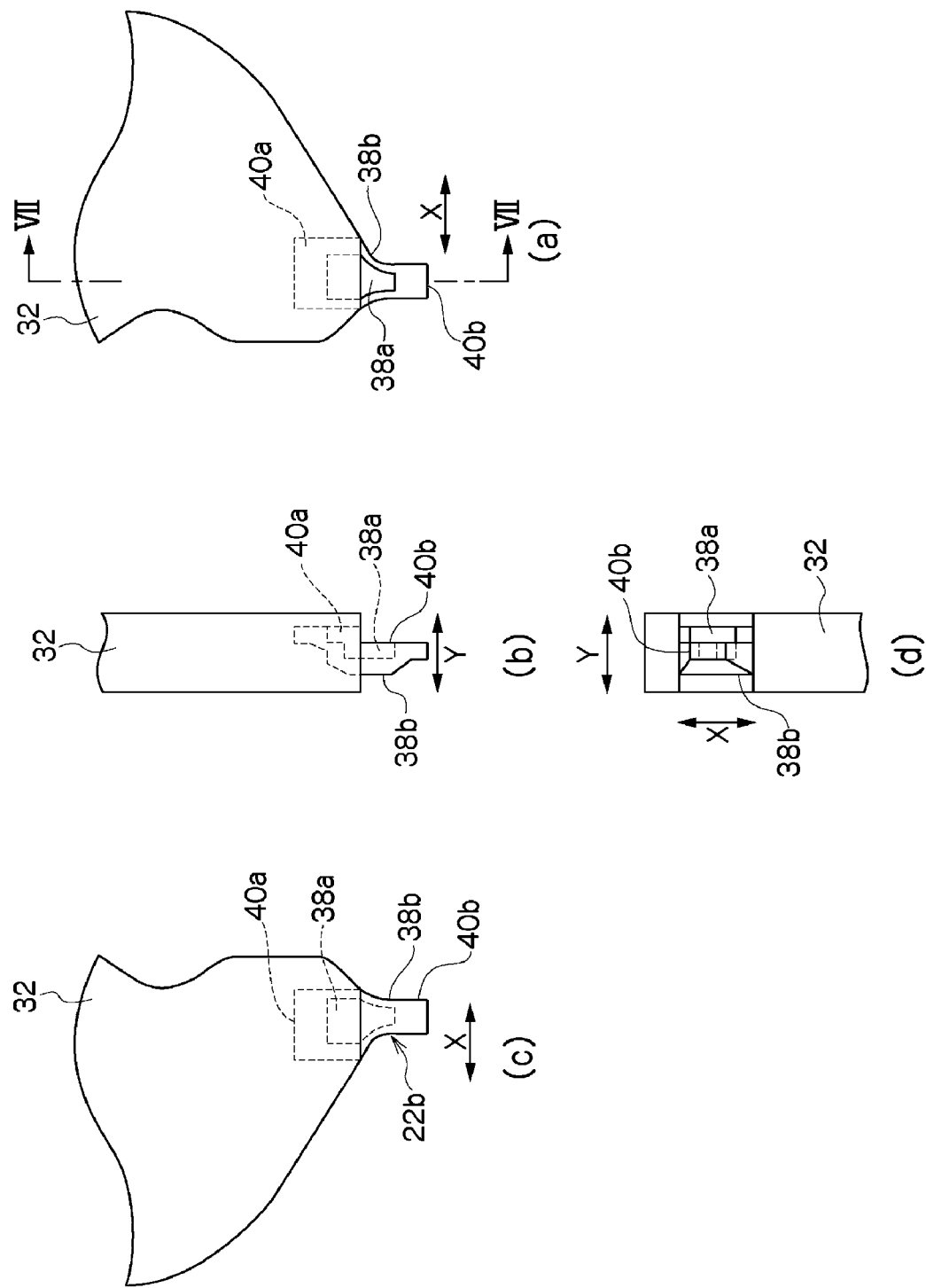
FIGS. 6(a) to 6(d) show a probe according to another embodiment of the present invention.
Figure 7:
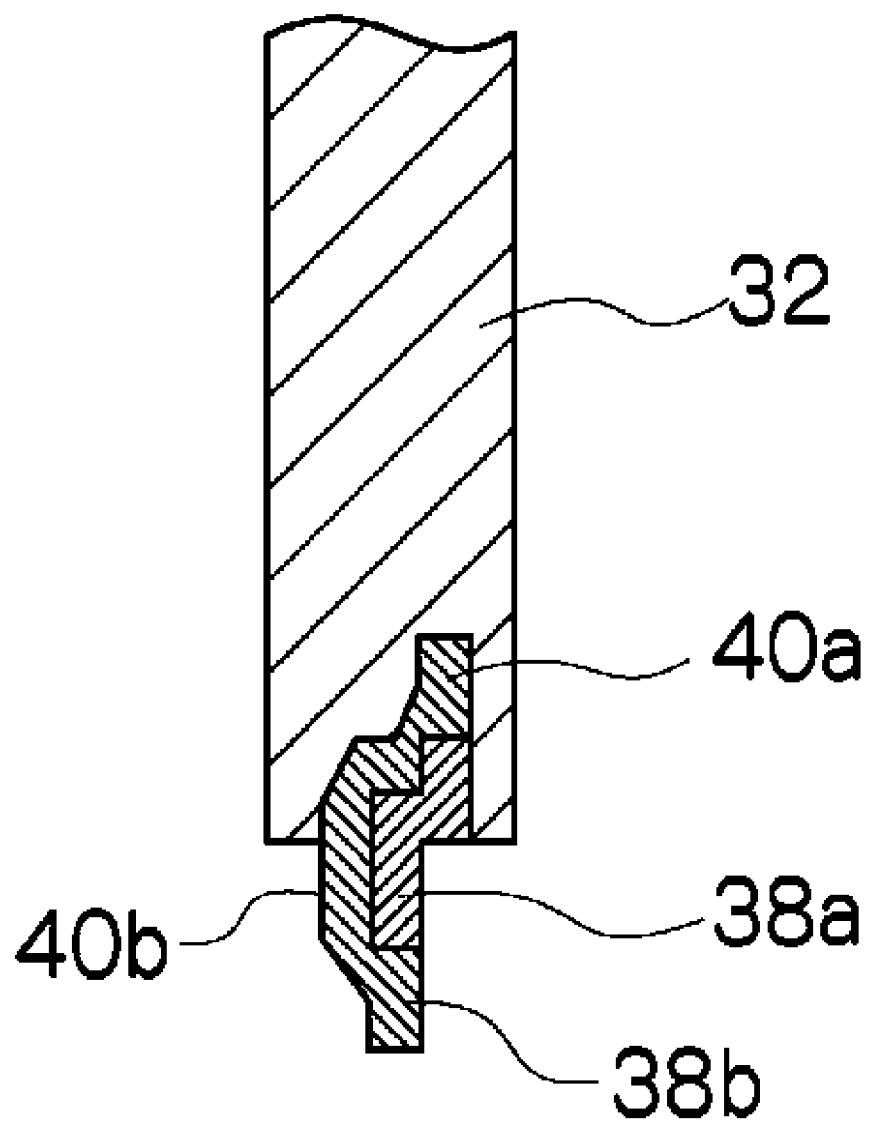
FIG. 7 is a cross-sectional view obtained along the line VII-VII shown in FIG. 6(a).

Next, a method for manufacturing the probe 22 according to the present invention is explained with reference to FIG. 5. For simplification of the explanation and drawings, the following example explains a probe representing a plurality of probes to be formed simultaneously.

For manufacturing the probe 22 according to the present invention, a metal plate such as a stainless plate is used as a base table 50 as shown in FIG. 5(a). On the base table 50 is formed a resist pattern 52 having an opening 52a for a sacrificial layer to be removed by an etching process described later (FIG. 5(b)). The resist pattern 52 is obtained by uniformly applying photosensitive photoresist on the base table 50, selectively exposing the photoresist via a photo mask, and thereafter developing the photoresist, as is conventionally well known.

In the opening 52a is deposited a sacrificial layer material such as copper by e.g., a plating technique thus to form a lower portion 54a of the sacrificial layer (FIG. 5(c)). After the lower portion 54a is formed on the base table 50, the resist pattern 52 is removed (FIG. 5(d)). Subsequently, a resist pattern 56 having an opening 56a that exposes the center portion of the lower portion 54a is formed to cover the base table 50 in a similar manner to that for the resist pattern 52 (FIG. 5(e)).

On the lower portion 54a is deposited a similar sacrificial layer material to that for the lower portion 54a within the opening 56a thus to form an upper portion 54b of the sacrificial layer (FIG. 5(f)). In this example, since the upper portion 54b is formed at the center portion of the lower portion 54b, a step is formed on each side of the upper portion 54b. Thus, when the resist pattern 56 is removed, a mountain-shaped sacrificial layer 54 consisting of the lower portion 54a and the upper portion 54b and stepped on both sides is exposed on the base table 50 (FIG. 5(g)).

After removal of the resist pattern 56, a resist pattern 58 covering the sacrificial layer 54 and for forming an opening 58a adjacent to the sacrificial layer and having a flat surface shape of the probe main body section 22a is formed in a similar manner to the aforementioned one, as shown in FIG. 5(h). In this opening 58a is deposited a metal material 60a such as nickel for the probe main body section 22a with approximately the same thickness dimension as that of the lower portion 54a so as to be on approximately the same height level as that of the lower portion 54a (FIG. 5(i)). Thereafter, the resist pattern 58 is removed. By the deposition of the metal material 60a, a thin-plate-shaped one side portion (60a) formed in the flat surface shape of the probe main body section 22a shown in FIG. 2 is formed on one side of the upper portion 54b. At a portion formed at the one side portion (60a) for the probe main body section 22a and corresponding to the tip end of the pedestal portion 32 of the probe main body section 22a, the lower portion 54a of the sacrificial layer 54 is supposed to be located, continuing into the portion (FIG. 5(j)).

Next, as shown in FIG. 5(k), a resist pattern 62 having an opening 62a for the first deposition portion 38a of the probe tip section 22b is formed to cover the sacrificial layer 54, the aforementioned one side portion (60a), and the base table 50. The opening 62a is adjacent to the joint between the lower portion 54a of the sacrificial layer 54 and the one side portion (60a) for the probe main body section 22a and is opened on the lower portion 54a. The opening 62a has a flat surface shape corresponding to the flat surface shape of the first deposition portion shown by the numeral 38a in FIG. 3(a).

In the opening 62a is deposited by e.g., a plating technique a metal material for the probe tip section 22b with a thickness dimension that exceeds a dimension from the upper surface of the lower portion 54a to the height position of the upper portion 54b, thus to form the first deposition portion 38a (FIG. 5(l)).

After formation of the first deposition portion 38a, the resist pattern 62 is removed (FIG. 5(m)), and after removal of the resist pattern 62, a resist pattern 64 having an opening 64a for the second deposition portion 38b is formed on the base table 50 (FIG. 5(n)). This opening 64a has a flat surface shape corresponding to the flat surface shape of the probe tip section shown by the numeral 22b in FIG. 3(c).

As shown in FIG. 5(o), the same metal material as the first deposition portion 38a is deposited in the opening 64a in a similar manner, and thereafter the resist pattern 64 is removed (FIG. 5(p)). By the deposition of the metal material, the second deposition portion 38b comprising an edge portion 38ba located on the aforementioned one side portion (60a) exposed in the opening 64a, an upright portion 38bb upright along the first deposition portion 38a, and an edge portion 38bc spreading from the upper surface of the first deposition portion 38a to the upper surface of the upper portion 54b is formed. The probe tip section 22b is formed by the first deposition portion 38a and the second deposition portion 38b covering the deposition portion.

Thereafter, as shown in FIG. 5(q), a resist pattern 66 having an opening 66a for the remaining portion of the probe main body section 22a is formed on the base table 50. The opening 66a has the same flat surface shape as that of the opening 58a of the resist pattern 58 and exposes the edge portion 38ba of the first deposition portion 38a located on the aforementioned one side portion (60a), the upright portion 38bb of the second deposition portion 38b upright from the edge portion, and the aforementioned one side portion (60a).

In the opening 66a is deposited the same metal material 60b as the aforementioned one side portion (60a) (FIG. 5(r)). By the deposition of the metal material 60b, the edge portion 38ba and the upright portion 38bb of the second deposition portion 38b are buried. Thus, the edge portion 38ba and the upright portion 38bb form the base portion 40a of the probe tip section 22b.

After deposition of the metal material 60b, the resist pattern 66 is removed, and the sacrificial layer 54 is also removed by etching (FIG. 5(s)). As a result, the probe 22 comprising the probe main body section 22a consisting of the aforementioned metal materials 60a and 60b and the probe tip section 22b consisting of the first deposition portion 38a and the second deposition portion 38b whose base portion 40a is buried in the probe main body section 22a is formed on the base table 50 (FIG. 5(t)).

When the finished probe 22 is detached from the base table 50, etchant can be utilized. At this moment, as the opening 34 formed on the probe 22 facilitates the etchant going between the base table 50 and the probe 22 on the base table as shown in FIG. 2, it promotes the detachment effect by the etchant.

FIGS. 6(a) to 6(d) and FIG. 7 show another embodiment of the probe 22 according to the present invention. The portions having the same functions as those shown in FIGS. 3(a) to 3(d) and FIG. 4 have the same reference numerals.

In FIGS. 3(a) to 3(d) and FIG. 4, the base portion 40a of the probe tip section 22b is constituted by the second deposition portion 38b, and the first deposition portion 38a as a core member does not reach the base portion 40a. On the other hand, in the probe 22 shown in FIGS. 6(a) to 6(d) and FIG. 7, the first deposition portion 38a extends to the base portion 40a of the probe tip section 22b together with the second deposition portion 38b. Thus, the example shown in FIGS. 6(a) to 6(d) and FIG. 7 is more preferable in terms of the strength than the example shown in FIGS. 3(a) to 3(d) and FIG. 4.

Hereinafter, a method for manufacturing the probe 22 shown in FIGS. 6(a) to 6(d) and FIG. 7 is explained with reference to FIG. 8.

A base table 50 is prepared (FIG. 8(a)), and a resist pattern 52 having an opening 52a is formed on the base table 50 (FIG. 8(b)). In the opening 52a is formed a lower portion 54a of a sacrificial layer (FIG. 8(c)). Thereafter, the resist pattern 52 is removed (FIG. 8(d)). Also, after removal of the resist pattern 52, a resist pattern 56 having an opening 56a is formed to cover the base table 50 in a similar manner to that for the resist pattern 52 (FIG. 8(e)).

In the example shown in FIG. 5(e), the center portion of the lower portion 54a is exposed from the opening 56a, and its both edges are covered with the resist pattern 56. On the other hand, in the example shown in FIG. 8(e), one edge of the lower portion 54a, as well as its center portion, is exposed from the opening 56a while the other edge is covered with the resist pattern 56.

Figure 8:
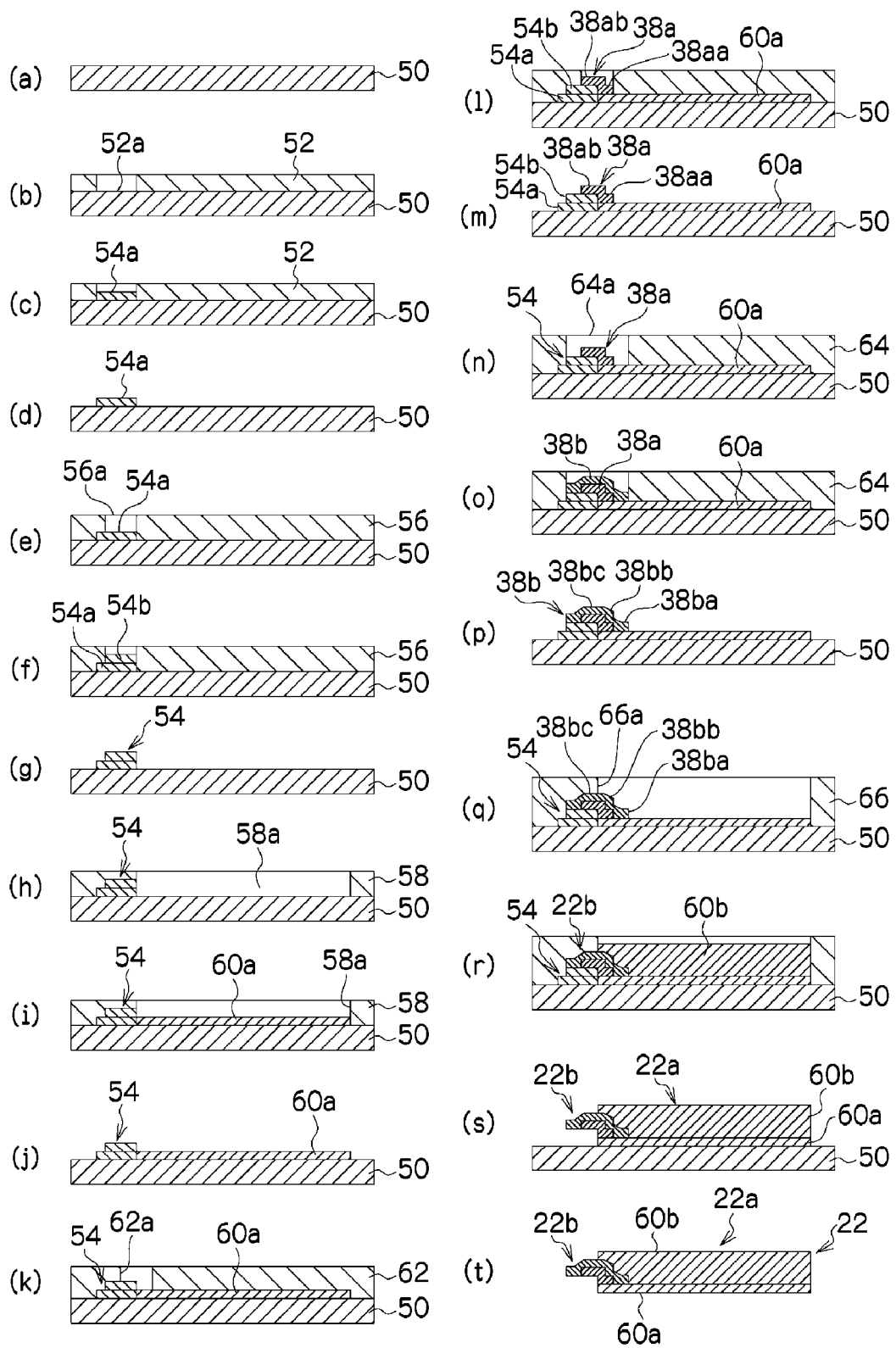
FIGS. 8(a) to 8(t) are schematic diagrams showing respective steps of a method for manufacturing the probe shown in FIG. 6.

Thus, when a similar sacrificial layer material to the lower portion 54a is deposited in the opening 56a, which causes formation of an upper portion 54b of the sacrificial layer (FIG. 8(f)), the upper portion 54b is formed at a one-sided position on either end of the lower portion 54a in the example in FIG. 8. More specifically, the wall surfaces on one side of the upper portion 54b and the lower portion 54a are aligned approximately vertically, and a step is formed only on the other side of the upper portion 54b. Thus, when the resist pattern 56 is removed, a sacrificial layer 54 consisting of the lower portion 54a and the upper portion 54b and stepped only on either side is exposed on the base table 50 (FIG. 8(g)).

After removal of the resist pattern 56, a resist pattern 58 for forming an opening 58a having a flat surface shape of the probe main body section 22a is formed (FIG. 8(h)). At this moment, the resist pattern 58 covers the sacrificial layer 54, and its vertical wall surface is exposed, corresponding to the peripheral wall of the opening 58a. Thus, when a metal material 60a for the probe main body section 22a is deposited in the opening 58a so as to be as thick as the lower portion 54a (FIG. 8(i)), and thereafter the resist pattern 58 is removed, a one side portion (60a) for the probe main body section 22a is formed, continued from the aforementioned vertical wall surface of the sacrificial layer 54 (FIG. 8(j)).

Next, as shown in FIG. 8(k), a resist pattern 62 having an opening 62a for the first deposition portion 38a of the probe tip section 22b is formed. This opening 62a is opened over a joint of the one side portion (60a) contacting the aforementioned vertical wall surface of the sacrificial layer 54 and over the upper portion 54b.

Thus, a metal material for the probe tip section 22b is deposited in the opening 62a thus to form the first deposition portion 38a (FIG. 8(l)). This first deposition portion 38a has a lower part 38aa on the aforementioned one side portion (60a) and an upper part 38ba on the upper portion 54b constituting a step together with the lower part.

After formation of the first deposition portion 38a, the resist pattern 62 is removed (FIG. 8(m)), and after removal of the resist pattern 62, a resist pattern 64 having an opening 64a for the second deposition portion 38b is formed on the base table 50 (FIG. 8(n)). The opening 64a exposes the first deposition portion 38a, the upper portion 54b of the sacrificial layer 54 exposed from the first deposition portion, and an area of the aforementioned one side portion (60a) in proximity to the first deposition portion 38a.

In the opening 64a is deposited the same metal material as the first deposition portion 38a (FIG. 8(o)), and thereafter the resist pattern 64 is removed (FIG. 8(p)). As a result, the second deposition portion 38b comprising an edge portion 38ba on the aforementioned one side portion (60a), an upright portion 38bb upright from the edge portion along the first deposition portion 38a, and an edge portion 38bc reaching the upper portion 54b of the sacrificial layer 54 is formed.

The second deposition portion 38b forms the probe tip section 22b together with the first deposition portion 38a. At this moment, the lower part 38aa of the first deposition portion 38a and the edge portion 38ba and the upright portion 38ba of the second deposition portion 38b are located on or above the aforementioned one side portion (60a).

Thereafter, as shown in FIG. 8(q), a resist pattern 66 having an opening 66a for the remaining portion of the probe main body section 22a is formed on the base table 50. The opening 66a has the same flat surface shape as that of the opening 58a of the resist pattern 58 and exposes the lower part 38aa of the first deposition portion 38a in the probe tip section 22b, the edge portion 38ba and the upright portion 38bb of the second deposition portion 38b in the probe tip section 22b, and the aforementioned one side portion (60a).

Thus, when the same metal material 60b as the aforementioned one side portion (60a) is deposited in the opening 66a (FIG. 8(r)), the lower part 38aa of the first deposition portion 38a and the edge portion 38ba and the upright portion 38bb of the second deposition portion 38b in the probe tip section 22b form the base portion 40a buried in the probe main body section 22a.

After deposition of the metal material 60b, the resist pattern 66 and the sacrificial layer 54 are removed (FIG. 8(s)), and also the probe 22 is detached from the base table 50 thus to form the probe 22.

In the probe 22 manufactured in accordance with the steps shown in FIG. 8, the first deposition portion 38a extends to the base portion 40a. Also, since combination of the first deposition portion 38a and the second deposition portion 38b causes increase of the cross-sectional area at the base portion 40a and a portion of the probe tip main body portion 40b in proximity to the base portion 40a in the probe tip section 22b, the mechanical strength at the portion of the probe tip main body portion 40b in proximity to the base portion 40a and the base portion can be increased more than in the conventional case. Thus, the durability of the probe 22 can be further enhanced.

Although the present invention has been explained, taking the example in which the same metal materials are used for the first deposition portion 38a and the second deposition portion 38b, metal materials having different features may be used for the first deposition portion 38a and the second deposition portion 38b as needed.

The present invention is not limited to the above embodiments but may be altered in various ways without departing from the spirit and scope of the present invention.

What is claimed is:

1. A method for manufacturing a probe comprising a probe tip section and a probe main body section having a pedestal portion on which said probe tip section is formed to be protruded, said method comprising:

after depositing a metal material on a base table to form a first deposition portion for said probe tip section, forming a second deposition portion entirely covering said first deposition portion, wherein combination of said first deposition portion and said second deposition portion causes increase of the thickness dimension of said probe tip section along the deposition direction of the metal material for said probe tip section, wherein said first deposition portion is a core portion for said probe tip section, wherein said second deposition portion is formed corresponding to a flat surface shape of said probe tip section, and wherein said second deposition portion is formed by initially forming said core portion, and thereafter forming a resist pattern having an opening that exposes the entire region of said core portion and is formed in a flat shape corresponding to the flat surface shape of said probe tip section containing a probe tip of said probe tip section, and depositing the metal material for said probe tip section in said opening, such that said second deposition portion forms said probe tip section integrally with said core portion.

2. The method for manufacturing a probe according to claim 1, said method further comprising the steps of:

after removing said resist pattern, forming a resist pattern covering said probe tip of said probe tip section and having an opening that exposes an upright portion of said second deposition portion deposited at least along said core portion at an end portion opposite said probe tip and is formed in a flat surface shape corresponding to a flat surface shape of said probe main body section; and depositing a metal material for said probe main body section in said opening of said resist pattern.

3. The method for manufacturing a probe according to claim 2, wherein the metal material for said probe main body section is a conductive material that is greater in toughness than the metal material for said probe tip section, the metal material for said first deposition portion is a conductive material that is higher in hardness than the metal material for said probe main body section, and the metal material for said second deposition portion is the same as the metal material for said first deposition portion.

4. The method for manufacturing a probe according to claim 1, wherein said first deposition portion is a core portion for said probe tip section, prior to formation of said core portion, a stepped sacrificial layer having a lower portion and an upper portion is formed on said base table, the metal material for said probe main body section is deposited in a layered form to continue into said lower portion of said sacrificial layer so as to be on approximately the same height level as that of said lower portion to form a one side portion of said probe main body section, and thereafter either of said metal materials for said probe tip section is deposited to cover a part of said one side portion.

5. The method for manufacturing a probe according to claim 4, wherein said core portion is formed to extend on said one side portion.

6. The method for manufacturing a probe according to claim 4, wherein said one side portion of said probe main body section is formed by forming a resist pattern having an opening formed in a flat surface shape corresponding to the flat surface shape of said probe main body section and covering said sacrificial layer and thereafter depositing said metal material in said opening of said resist pattern, and after deposition of said metal material, the remaining portion of said probe main body section is formed by depositing the metal material for said probe main body section on said one side portion, using a resist pattern having the same shape as that of the resist pattern used to form said one side portion.

7. The method for manufacturing a probe according to claim 2, wherein said probe main body section comprises an attachment portion and a pair of arm portions extending in a lateral direction from said attachment portion to be distanced from each other in its height direction, and said pedestal portion is formed to extend to the opposite side of a side where said attachment portion is located, seen from said arm portions so as to connect extending ends of said arm portions.

8. A method for manufacturing an electrical test probe having a probe main body and a probe tip that protrudes from the probe main body, the method comprising:
  forming a sacrificial structure on a flat exposed surface of a base table;
  forming, from a specified metal material, a first side portion of the probe main body on the flat exposed surface of the base table, and adjacent to the sacrificial structure;
  thereafter, depositing metal material overlying a portion of the sacrificial structure to form a first deposition portion of the probe tip;
  thereafter, depositing metal material overlying and entirely covering the first deposition portion and overlying some of the first side portion of the probe main body, to form a second deposition portion of the probe tip; and
  forming, from the specified metal material, a second side portion of the probe main body overlying some of the first side portion of the probe main body and overlying some of the second deposition portion of the probe tip, wherein forming the second side portion of the probe main body buries some of the second deposition portion of the probe tip in the specified metal material.

9. The method of claim 8, wherein, after forming the second side portion of the probe main body, the method further comprises the step of removing the sacrificial structure while leaving the first deposition portion of the probe tip and the second deposition portion of the probe tip intact.

10. The method of claim 9, wherein, after removing the sacrificial structure, the method further comprises the step of detaching the electrical test probe from the base table.

* * * * *